(12) United States Patent
Jacobson et al.

(10) Patent No.: US 12,735,788 B2
(45) Date of Patent: Sep. 15, 2026

(54) MULTIPLE INPUT POST MIX SHOWERHEAD

(71) Applicant: Tokyo Electron Limited, Tokyo (JP)

(72) Inventors: Norman Jacobson, Albany, NY (US); Ronald Nasman, Albany, NY (US); Kandabara Tapily, Mechanicsville, NY (US)

(73) Assignee: Tokyo Electron Limited, Tokyo (JP)

( * ) Notice: Subject to any disclaimer, the term of this patent is extended or adjusted under 35 U.S.C. 154(b) by 427 days.

(21) Appl. No.: 18/493,419

(22) Filed: Oct. 24, 2023

(65) Prior Publication Data

US 2025/0129475 A1 Apr. 24, 2025

(51) Int. Cl.
*C23C 16/455* (2006.01)
*C23C 16/458* (2006.01)
*H01J 37/32* (2006.01)

(52) U.S. Cl.
CPC .. *C23C 16/45565* (2013.01); *C23C 16/45544* (2013.01); *C23C 16/4583* (2013.01); *H01J 37/3244* (2013.01); *H01J 37/32449* (2013.01)

(58) Field of Classification Search
CPC ........ C23C 16/45565; C23C 16/45544; C23C 16/4583; C23C 16/45574; H01J 37/3244; H01J 37/32449
USPC .......................................................... 118/728
See application file for complete search history.

(56) References Cited

U.S. PATENT DOCUMENTS 5,963,834 A * 10/1999 Hatano ............ C23C 16/45574 438/680
7,479,303 B2 1/2009 Byun
7,976,631 B2 7/2011 Burrows et al.
9,388,492 B2 7/2016 White et al.
11,208,722 B2 12/2021 White et al.
(Continued)

FOREIGN PATENT DOCUMENTS

JP 5026373 * 9/2012
JP 2014-229693 A 12/2014
KR 10-2018-0133007 A 12/2018

OTHER PUBLICATIONS

Machine Translation JP 5026373 (Year: 2012).*
(Continued)

*Primary Examiner* — Rodney G Mcdonald
(74) *Attorney, Agent, or Firm* — Oblon, McClelland, Maier & Neustadt, L.L.P.

(57) ABSTRACT

Aspects of the present disclosure provide an apparatus, which includes first gas channels distributing a first process gas and second gas channels alternating with the first gas channels and distributing a second process gas. The apparatus further includes first feed tubes each including first outlets configured to deliver the first process gas to a row of the first gas channels via the first outlets along different first flow paths of a same first length, and second feed tubes each including second outlets corresponding to a row of the second gas channels and configured to deliver the second process gas to the row of the second gas channels via the second outlets along different second flow paths of a same second length. The apparatus further includes vertical gas conduits each vertically extending from a respective one of the array of gas channels configured to transmit the first or second process gas.

15 Claims, 8 Drawing Sheets

(56) References Cited

U.S. PATENT DOCUMENTS

| | | | | |
|---|---|---|---|---|
| 2006/0096541 | A1* | 5/2006 | Seo | C23C 16/4482 118/724 |
| 2021/0180208 | A1* | 6/2021 | Daigo | C30B 25/14 |
| 2021/0375644 | A1 | 12/2021 | de Ridder et al. | |
| 2022/0122851 | A1* | 4/2022 | Ruan | H01J 37/32357 |

OTHER PUBLICATIONS

Machine Translation KR 10-2018-0133007 (Year: 2018).*
International Search Report and Written Opinion issued Jan. 9, 2025 in PCT/US2024/049730, 9 pages.

* cited by examiner

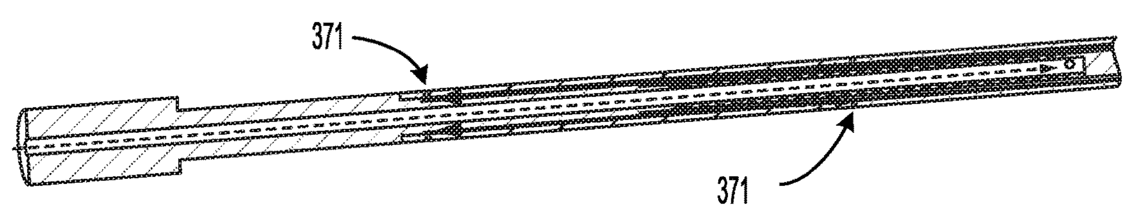
FIG. 3A
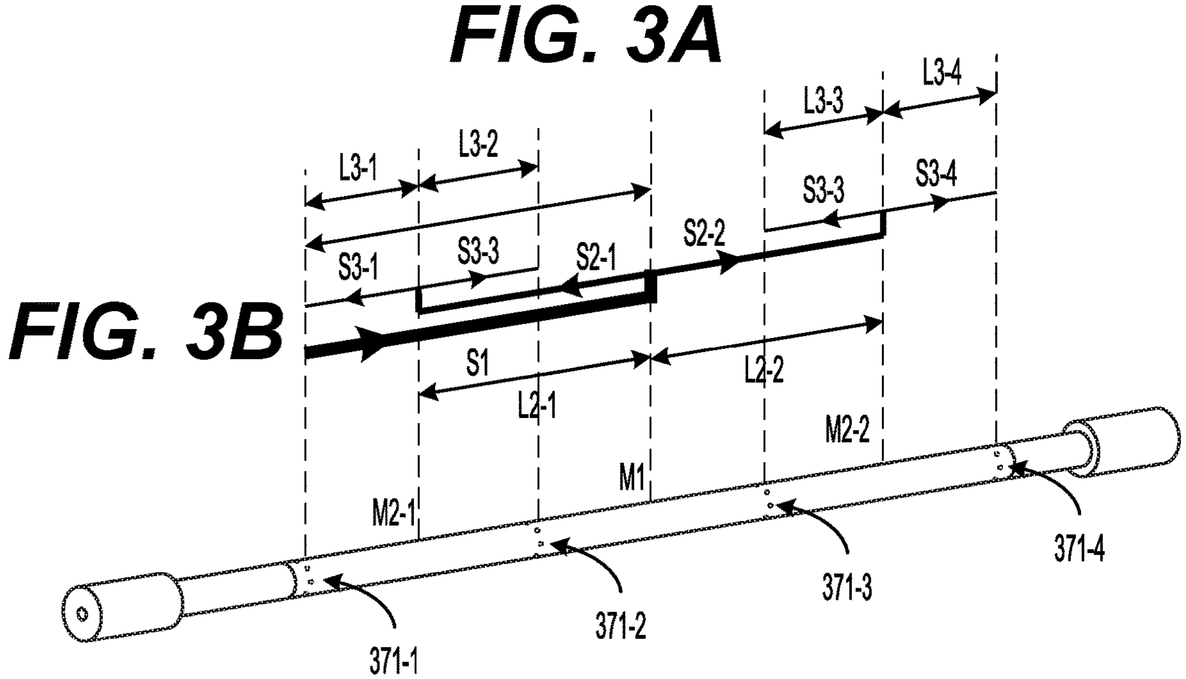
FIG. 3B
FIG. 3C

MULTIPLE INPUT POST MIX SHOWERHEAD

FIELD OF THE PRESENT DISCLOSURE

The present disclosure relates generally to apparatuses used in a chemical vapor deposition (CVD) process, an atomic layer deposition (ALD) process, etc. performed on a substrate, and, in particular, to a showerhead used in a CVD process, an ALD process, etc. performed on a substrate.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In an apparatus used in a chemical vapor deposition (CVD) process, an atomic layer deposition (ALD) process, etc., chemicals, e.g., in the form of reactive gases, can be introduced into a vacuum chamber, e.g., by passing through a showerhead, then reach a substrate holder on which a substrate, e.g., a semiconductor wafer, can be located, and cause chemical reaction on the substrate to form a desired film thereon.

SUMMARY

Aspects of the present disclosure provide an apparatus. For example, the apparatus can include an array of gas channels that extend parallel to each other. For example, the array of gas channels can include a plurality of rows of first gas channels that are configured to distribute a first process gas. As another example, the array of gas channels can also include a plurality of rows of second gas channels that alternate with the rows of first gas channels and configured to distribute a second process gas. The apparatus can further include an array of feed tubes located above the array of channels. For example, the array of feed tubes can include first feed tubes, each of which includes a plurality of first outlets corresponding to a row of the first gas channels and is configured to deliver the first process gas to the row of the first gas channels via the first outlets along different first flow paths of a same first length. As another example, the array of feed tubes can also include second feed tubes, each of which includes a plurality of second outlets corresponding to a row of the second gas channels and is configured to deliver the second process gas to the row of the second gas channels via the second outlets along different second flow paths of a same second length. The apparatus can further include a plurality of vertical gas conduits, each of which vertically extends from a respective one of the array of gas channels and configured to transmit the first process gas or the second process gas.

In an embodiment, each of the first feed tubes can include a plurality of first concentric feed conduits with a first flow path that splits the first process gas to flow toward opposite directions as the first process gas flows from an inner first feed conduit to outer first feed conduits until reaching a corresponding one of the outlets of the first feed tube. For example, the inner first feed conduit can be larger than the outer first feed conduit, allowing a greater amount of the first process gas to flow in the inner first feed conduct than in the outer first feed conduit.

In an embodiment, the apparatus can further include a processing chamber, to which the gas conduits transmit the first process gas and the second process gas and within which the first process gas and the second process gas react with each other. In another embodiment, the apparatus can further include a substrate holder configured for receiving a substrate such that the substrate is disposed within the processing chamber for the reacted first and second process gases to be deposited thereon. In some embodiments, the apparatus can further include a purge gas inlet formed on a sidewall of at least one of the gas conduits. For example, the apparatus can further include a controller configured to control flowing of the purge gas such that the purge gas enters the gas conduit and flows with the at least one of the first process gas and the second process gas to the processing chamber. As another example, the controller can be further configured to control flowing of the purge gas such that the purge gas enters the gas conduit and flows toward a source of at least one of the first process gas and the second process gas.

In an embodiment, the apparatus can further include a controller configured to control flowing of the first process gas and the second process gas. In another embodiment, one of the gas channels can have a rectangular cross section. In some embodiments, the first gas channels can be in fluid isolation from the second gas channels.

In an embodiment, the apparatus can further include a plurality of purge caps, through which a purge gas flows and joins the first gas channels and the second gas channels. In another embodiment, each of the purge caps can include a cap inlet, a purge gas conduit and a cap outlet. For example, the purge gas conduit can be spiral.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present disclosure can be embodied and viewed in many different ways.

Note that this summary section does not specify every embodiment and/or incrementally novel aspect of the present disclosure or claimed disclosure. Instead, this summary only provides a preliminary discussion of different embodiments and corresponding points of novelty over conventional techniques. For additional details and/or possible perspectives of the present disclosure and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein:

FIG. 3A is a cross sectional view of a left half of an exemplary feed tube of the showerhead according to some embodiments of the present disclosure;

FIG. 3B shows flow paths (or concentric feed conduits) along which a process gas travels in the feed tube according to some embodiments of the present disclosure;

FIG. 3C is a schematic diagram of the feed tube according to some embodiments of the present disclosure;

DETAILED DESCRIPTION

Figure 1:
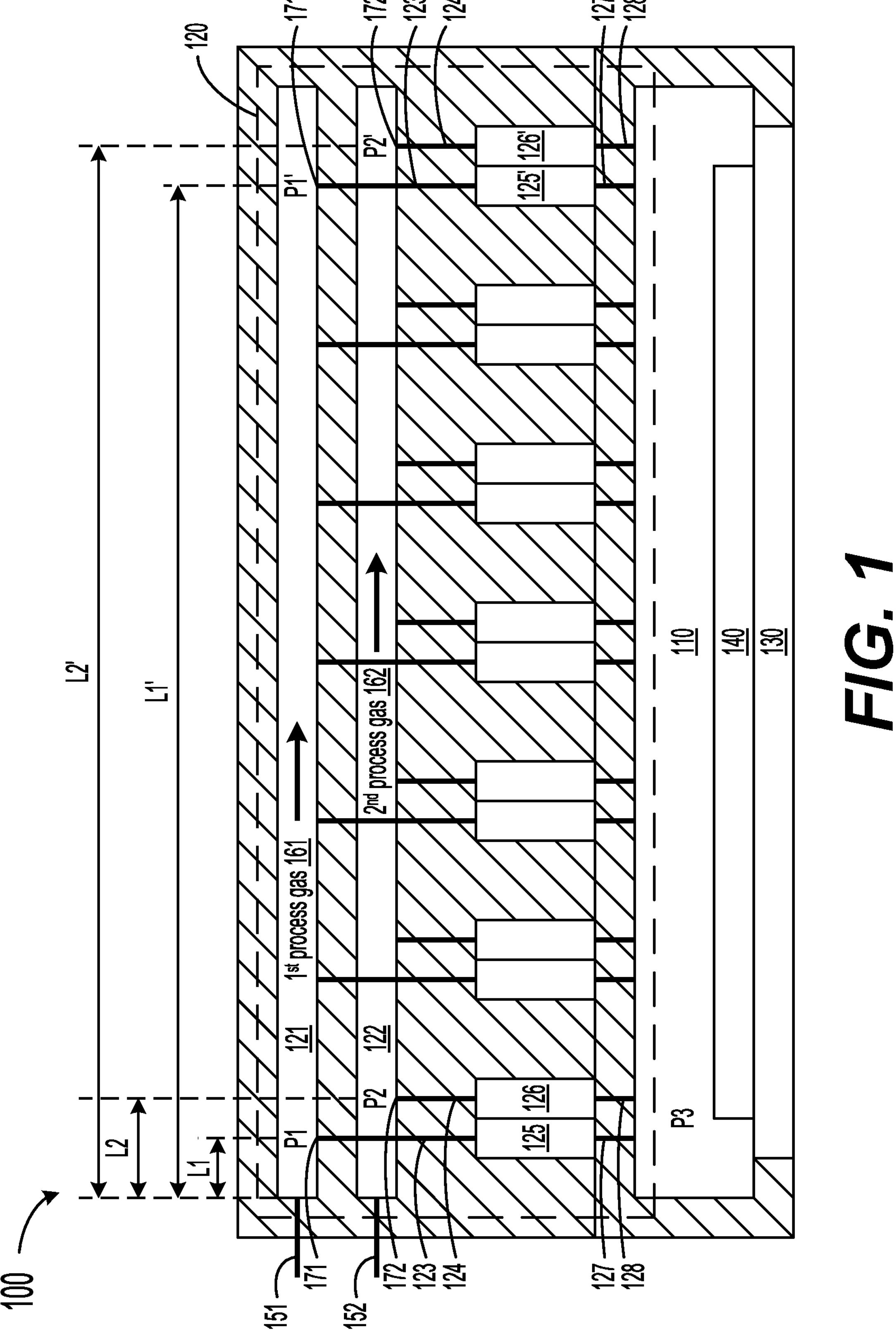
FIG. 1 is a schematic diagram of an apparatus used in a chemical vapor deposition (CVD) process, an atomic layer deposition (ALD) process, etc.

FIG. 1 is a schematic diagram of an apparatus 100 used in a chemical vapor deposition (CVD) process an atomic layer deposition (ALD) process, etc. The apparatus 100 can include a processing chamber 110, a showerhead 120 disposed above the processing chamber 110, and a substrate holder (or carrier) 130 disposed on the bottom of the processing chamber 110 for a substrate 140, e.g., a semiconductor wafer, to be placed thereon. The substrate 140 can include sapphire, silicon carbide (SiC), silicon, gallium nitride (GaN), glass, etc.

The substrate holder 130 is shown in a lower position, where the substrate 140 may be placed on or not. In some embodiments, the substrate holder 130 can also move upward to a higher position, e.g., a processing position. The substrate holder 130 is shown to allow one substrate 140 to be placed on a top surface thereof. In some embodiments, the substrate holder 130 can include a plurality of recesses formed on the top surface thereof, each of the recesses allowing one of the substrate 140 to be placed therein. In an embodiment, the substrate holder 130 can rotate about an axis during the CVD process, the ALD process, etc.

In the CVD process, the ALD process, etc., different chemicals, in the form of reactive gases (called process gasses), e.g., precursor gases, carrier gases, purge gases, cleaning/etching gases or others, can be supplied via supply lines, e.g., a first supply line 151 and a second supply line 152, to the showerhead 120, and mix and react with each other in the processing chamber 110 to form a film (not shown) on the substrate 140.

The showerhead 120 can include a first plenum 121 that has a number of first outlets (or holes) 171 and 171', a second plenum 122 that has the number of second outlets (or holes) 172 and 172', the number of first gas channels 123 and 123', the number of second gas channels 124 and 124', the number of first gas conduits 125 and 125', and the number second gas conduits 126 and 126'. Each of the first plenum 121 and the second plenum 122 is perpendicular to the first gas channels 123 and 123', the second gas channels 124 and 124', the first gas conduits 125 and 125', and the second gas conduits 126 and 126'. The first gas channels 123 and 123' are parallel to each other, the second gas channels 124 and 124' are parallel to each other, the first gas conduits 125 and 125' are parallel to each other, and the second gas conduits 126 and 126' are parallel to each other. The first plenum 121 can be in fluid (or gas) communication via the first outlets 171 and 171' with the first gas conduits 125 and 125' through the first gas channels 123 and 123'. The second plenum 122 can be in fluid (or gas) communication via the second outlets 172 and 172' with the second gas conduits 126 and 126' through the second gas channels 124 and 124'. In some embodiments, the showerhead 120 can further include a central conduit (not shown) that conveys a non-reactive gas, e.g., inert gas such as helium (He) and argon (Ar), cleaning and/or etching gas or plasma, to the processing chamber 110.

During the processing of the substrate 140 in the CVD process, the ALD process, etc., e.g., depositing a film on the substrate 140, a first process gas 161, e.g., a first precursor gas, and a second process gas 162, e.g., a second precursor gas, that are separated from each other can be supplied from the first supply line 151 and the second supply line 152 into the first plenum 121 and the second plenum 122 of the showerhead 120, respectively, and, optionally, a non-reactive gas, e.g., He or Ar, can be supplied from an inert gas supply line (not shown) into the central conduit. The central conduit can help prevent gas recirculation in a central region of the processing chamber 110. The first process gas 161 then flows in the first plenum 121, via the first outlets 171 and 171', through the first gas channels 123 and 123' and the first gas conduit 125 and 125' sequentially, and into the processing chamber 110 via first gas injection holes 127 and 127'. Similarly, the second process gas 162 then flows in the second plenum 122, via the second outlets 172 and 172', through the second gas channels 124 and 124' and the second gas conduit 126 and 126' sequentially, and into the processing chamber 110 via second gas injection holes 128 and 128'. In an embodiment, the first gas injection holes 127 and 127' and the second gas injection holes 128 and 128' can have equal diameters. In another embodiment, the first gas injection holes 127 and 127' and the second gas injection holes 128 and 128' can have unequal diameters. The first process gas 161 and the second process 162 then mix (post-mix) and react with each other in the processing chamber 110 to form the film on the substrate 140.

The showerhead 120 of the apparatus 100 shown in FIG. 1 includes two plenums, i.e., the first plenum 121 and the second plenum 122, two corresponding sets of gas conduits, i.e., the first gas channels 123 and 123' and the second gas channels 124 and 124', and two corresponding sets of gas channels, i.e., the first gas conduits 125 and 125' and the second gas conduits 126 and 126'. In some embodiments, the showerhead 120 of the apparatus 100 can include three or more plenums, three or more corresponding sets of gas conduits, and three or more corresponding sets of gas channels.

The apparatus 100 can further include one or more temperature sensors (not shown), such as pyrometers, configured to measure the temperatures of the substrate 140 and the substrate holder 130 and send corresponding temperature data to a controller, which can thus adjust and maintain a predetermined temperature profile across the substrate 140 and the substrate holder 130, e.g., by controlling a heater (not shown). The temperature sensors can also be configured to measure the temperature of the showerhead 120, e.g., the temperature of a surface of the showerhead 120 facing the processing chamber 110, in order to eliminate or at least reduce formation of condensates, gas phase particles, etc. on the showerhead 120. The apparatus 100 can further include exhaust ports disposed on lateral walls of the processing chamber 110, and exhaust conduits coupled between the exhaust ports and a vacuum pump, which can control the rate at which exhaust gases are drawn from the processing chamber 110.

During the processing of the substrate 140 in the CVD process, the ALD process, etc. performed in the apparatus 100, the first process gas 161 supplied from the first supply line 151 will travel along different flow paths of different lengths in the first plenum 121 to arrive at different first outlets 171 and 171' and flow into the respective first gas channels 123 and 123'. For example, the first process gas 161 travels along a first flow path of a first distance L1 in the first plenum 121 to arrive at a first one of the first outlets 171 and 171', e.g., a leftmost first outlet 171, and flow into a first one of the first gas channels 123 and 123', e.g., a leftmost first gas channel 123 shown in FIG. 1, and travels along a second flow path of a second distance L1' in the first plenum 121 to arrive at a second one of the first outlets 171 and 171', e.g., a rightmost first outlet 171', and flow into a second one of the first gas channels 123 and 123', e.g., a rightmost first gas channel 123' shown in FIG. 1. As the first distance L1 and the second distance L1' are different, the first process gas 161 is delivered to the leftmost first gas channel 123 and the rightmost first gas channel 123' (and a leftmost first gas conduits 125 and a rightmost first gas conduit 125' as well) in an unbalanced manner. Specifically, a leftmost first gas pressure P1 of the first process gas 161 at the leftmost first outlet 171 is greater than a rightmost first gas pressure P1' of the first process gas 161 at the rightmost first outlet 171', that is a leftmost first pressure difference between the leftmost first gas pressure P1 and a chamber pressure P3 in the processing chamber 110, i.e., P1-P3, being greater than a rightmost first pressure difference between the rightmost first gas pressure P1' and the chamber pressure P3, i.e., P1'-P3, and, accordingly, the first process gas 161 has a greater concentration in the leftmost first gas channel 123 than in the rightmost first gas channel 123'.

Similarly, during the processing of the substrate 140 in the CVD process, the ALD process, etc. performed in the apparatus 100, the second process gas 162 supplied from the second supply line 152 will travel along different flow paths of different lengths in the second plenum 122 to arrive at different second outlets 172 and 172' and flow into the respective second gas channels 124 and 124'. For example, the second process gas 162 travels along a first flow path of a first distance L2 in the second plenum 122 to arrive at a first one of the second outlets 172 and 172', e.g., a leftmost second outlet 172, and flow into a first one of the second gas channels 124 and 124', e.g., a leftmost second gas channel 124 shown in FIG. 1, and travels along a second flow path of a second distance L2' in the second plenum 122 to arrive at a second one of the second outlets 172 and 172', e.g., a rightmost second outlet 172', and flow into a second one of the second gas channels 124 and 124', e.g., a rightmost second gas channel 124' shown in FIG. 1. As the first distance L2 and the second distance L2' are different, the second process gas 162 is delivered to the leftmost second gas channel 124 and the rightmost second gas channel 124' (and a leftmost second gas conduits 126 and a rightmost second gas conduit 126' as well) in an unbalanced manner. Specifically, a leftmost second gas pressure P2 of the second process gas 162 at the leftmost second outlet 172 is greater than a rightmost second gas pressure P2' of the second process gas 162 at the rightmost second outlet 172', that is a leftmost first pressure difference between the leftmost second gas pressure P2 and the chamber pressure P3, i.e., P2-P3, being greater than a rightmost second pressure difference between the rightmost second gas pressure P2' and the chamber pressure P3, i.e., P2'-P3, and, accordingly, the second process gas 162 has a greater concentration in the leftmost second gas channel 124 than in the rightmost second gas channel 124'.

As the first process gas 161 and the second process gas 162 have a greater concentration in the leftmost first gas channel 123 and the leftmost second gas channel 124 (and the leftmost first gas conduit 125 and the leftmost second gas conduit 126 as well) than in the rightmost first gas channel 123' and the rightmost second gas channel 124' (and the rightmost first gas conduit 125' and the rightmost second gas conduit 126' as well), the film deposited and formed on the substrate 140 has an ununiform thickness in a case where the wafer holder 130 has a flat top surface and only one of the substrate 140 is placed on the top surface of the substrate holder 130, or the films deposited and formed on the substrates 140 have different thicknesses in a case where the substrate holder 130 has a plurality of recesses formed on a top surface thereof and a plurality of the substrates 140 are placed in the recesses, respectively.

Aspects of the present disclosure provide a showerhead that can provide balanced delivery of chemicals, e.g., process gases, across a substrate in a CVD process, the ALD process, etc.

Figure 2A:
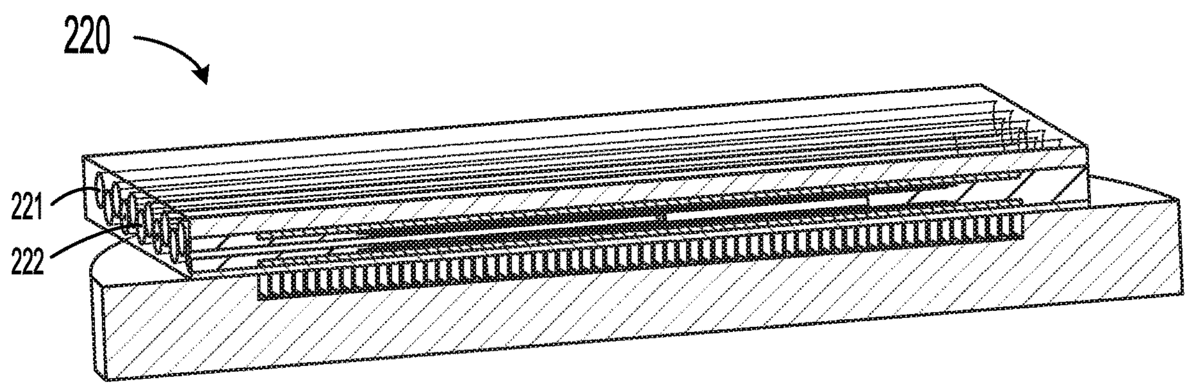
FIGS. 2A to 2C are schematic diagrams of an exemplary showerhead according to some embodiments of the present disclosure.
Figure 2B:
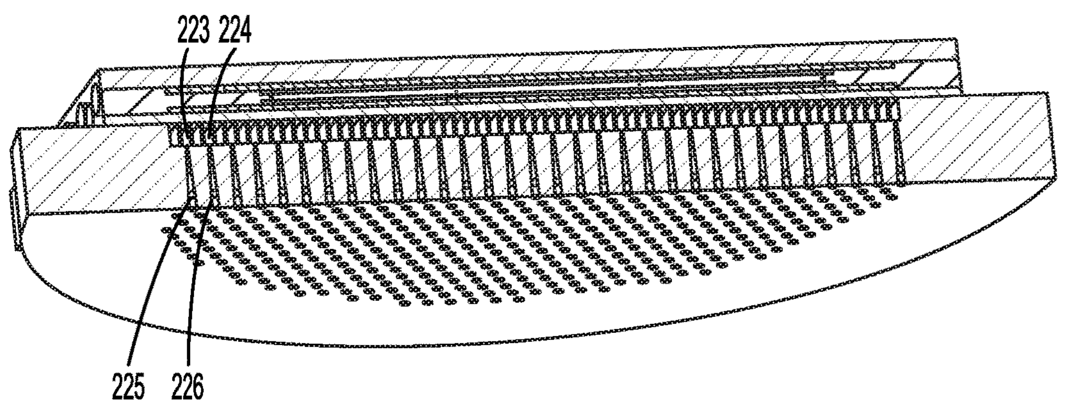
Figure 2C:
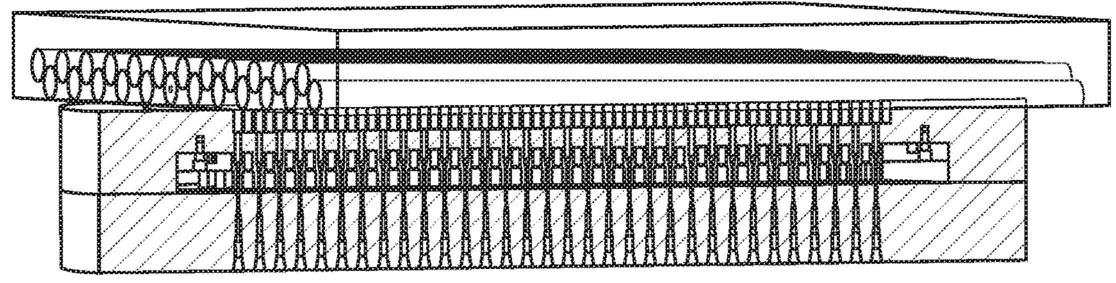

FIGS. 2A to 2C are schematic diagrams of an exemplary showerhead 220 according to some embodiments of the present disclosure. In the apparatus 100 used in a CVD process, an ALD process, etc., the showerhead 220 can replace the showerhead 120. With the showerhead 120 replaced by the showerhead 220, the apparatus 100 can perform balanced delivery of chemicals, e.g., process gases, to the surface of the substrate 140. The showerhead 220 can include a plurality of feed tubes that are disposed parallel to each other, each of the feed tubes including a plurality of outlets (or holes). For example, the showerhead 220 can include a plurality of first feed tubes 221 that are disposed parallel to each other, and a plurality of second feed tubes 222 that are disposed parallel to each other and alternate with the first feed tubes 221. In an embodiment, each of the first feed tubes 221 and the second feed tubes 222 can include a plurality of outlets (or holes). For example, at least one of the first feed tubes 221 can include $2^n$ first outlets 271, and at least one of the second feed tubes 222 can include $2^n$ second outlets 272, where n is an integer, as shown in FIGS. 3A and 3C. In an embodiment, the first outlets 271 of the first feed tubes 221 and the second outlets 272 of the second feed tubes 222 can be arranged in an array.

The showerhead 220 can further include a plurality of gas channels that are arranged in the array. For example, the showerhead 220 can include a plurality of first gas channels 223 and a plurality of second gas channels 224 that are arranged in the array. In an embodiment, the first gas channels 223 can be disposed parallel to each other and perpendicular to the first feed tubes 221 and be in fluid (or gas) communication with the first feed tubes 221 via the first outlets 271, and the second gas channels 224 can be disposed parallel to each other and perpendicular to the second feed tubes 222 and be in fluid (or gas) communication with the first feed tubes 221 via the second outlets 272. In another embodiment, the first gas channels 223 can be in fluid (gas) isolation from the second gas channels 224. In some embodiments, the first gas channels 223 and the second gas channels 224 can have rectangular cross sections.

The showerhead 220 can further include a plurality of gas conduits that are also arranged in the array. For example, the showerhead 220 can include a plurality of first gas conduits 225 and a plurality of second gas conduits 226 that are arranged in the array. In an embodiment, the first gas conduits 225 can be disposed parallel to each other and perpendicular to the first feed tubes 221 and be in fluid (or gas) communication with the first gas channels 223, and the second gas conduits 226 can be disposed parallel to each other and perpendicular to the second feed tubes 222 and be in fluid (or gas) communication with the second gas channels 224.

During the processing of the substrate 140 in the CVD process, the ALD process, etc. performed in the apparatus 100, which includes the showerhead 220 instead of the showerhead 120, the first process gas 161 supplied from the first supply line 151 (shown in FIG. 1) will travel along different flow paths in each of the first feed tubes 221 to arrive at the different first outlets 271 and flow into the respective first gas channels 223 and the respective first gas conduits 225. Similarly, during the processing of the substrate 140 in the CVD process, the ALD process, etc. performed in the apparatus 100, which includes the showerhead 220 instead of the showerhead 120, the second process gas 162 supplied from the second supply line 152 (shown in FIG. 1) will travel along different flow paths in each of the second feed tubes 222 to arrive at the different second outlets 272 and flow into the respective second gas channels 224 and the respective second gas conduits 226.

The showerhead 220 shown in FIGS. 2A-2C includes two sets of feed tubes, i.e., the first feed tubes 221 and the second feed tubes 222, two corresponding sets of gas channels, i.e., the first gas channels 223 and the second gas channels 224, and two corresponding sets of gas conduits, i.e., the first gas conduits 225 and the second gas conduits 226. In some embodiments, the showerhead 220 can include three or more sets of feed tubes, three or more corresponding sets of gas channels, and three or more corresponding sets of gas conduits, and each of the feed tubes can have a plurality of outlets, e.g., $2^{nd}$ outlets, where n is an integer.

Different from the showerhead 120, in which the different flow paths along which the first process gas 161 and the second process gas 162 travel in the first plenum 121 and the second plenum 122, respectively, are of different lengths, the showerhead 220 allows the first process gas 161 to travel in the each of the first feed tubes 221 along different flow paths of the same length and allows the second process gas 162 to travel in the each of the second feed tubes 222 along different flow paths of the same length.

FIG. 3A is a cross sectional view of a left half of an exemplary feed tube 321, e.g., the first feed tubes 221 and the second feed tubes 222, according to some embodiments of the present disclosure. FIG. 3B shows flow paths (or concentric feed conduits) along which a process gas, e.g., the first process gas 161 and the second process gas 162, travels in the feed tube 321 according to some embodiments of the present disclosure. FIG. 3C is a schematic diagram of the feed tube 331 according to some embodiments of the present disclosure. As shown in FIGS. 3A to 3C, the exemplary feed tube 331 can have $2^2$(=4) outlets, e.g., a $1^{st}$ outlet 371-1, a $2^{nd}$ outlet 371-2, a $3^{rd}$ outlet 371-3 and a $4^{th}$ outlet 371-4, that are separated from each other at the same distance, and a plurality of flow paths (or concentric feed conduits), e.g., concentric feed conduits S1, S2-1, S2-2, S3-1, S3-2, S3-3 and S3-4, that are used to deliver a process gas to the outlets.

In an embodiment, a process gas, e.g., the first process gas 161 and the second process gas 162, will travel in the feed tube 321 along different flow paths (or concentric feed conduits) of the same length to arrive at the different four outlets, i.e., the $1^{st}$ outlet 371-1, the $2^{nd}$ outlet 371-2, the $3^{rd}$ outlet 371-3 and the $4^{th}$ outlet 371-4. For example, the process gas, e.g., the first process gas 161 and the second process gas 162, supplied from a supply line, e.g., the first supply line 151 and the second supply line 152, will travel in the feed tube 311 along a $1^{st}$ flow path consisting of a first-half flow segment (or a first concentric feed conduit) S1 that starts at the $1^{st}$ outlet 371-1 and ends at a first middle point M1 between the $1^{st}$ outlet 371-1 and the $4^{th}$ outlet 371-4, a second-half $1^{st}$ flow segment (or a second-half $1^{st}$ concentric feed conduit) S2-1 that starts at the first middle point M1 and ends at a second $1^{st}$ middle point M2-1 between the $1^{st}$ outlet 371-1 and the $2^{nd}$ outlet 371-2, and a third-half $1^{st}$ flow segment (or a third-half $1^{st}$ concentric feed conduit) S3-1 that starts at the second $1^{st}$ middle point M2-1 and ends at the $1^{st}$ outlet 371-1 to arrive at the $1^{st}$ outlet 371-1. The process gas can also travel in the feed tube 311 along a $2^{nd}$ flow path consisting of the first-half flow segment (or the first-half concentric feed conduit) S1, the second-half $1^{st}$ flow segment (or the second-half concentric feed conduit) S2-1, and a third-half $2^{nd}$ flow segment (or a third-half $2^{nd}$ concentric feed conduit) S3-2 that starts at the second $1^{st}$ middle point M2-1 and ends at the $2^{nd}$ outlet 371-2 to arrive at the $2^{nd}$ outlet 371-2. The process gas can also travel in the in the feed tube 311 along a $3^{rd}$ flow path consisting of the first-half flow segment (or the first-half concentric feed conduit) S1, a second-half $2^{nd}$ flow segment (or a second-half $2^{nd}$ concentric feed conduit) S2-2 that starts at the first middle point M1 and ends at a second $2^{nd}$ middle point M2-2 between the $3^{rd}$ outlet 371-3 and the $4^{th}$ outlet 371-4, and a third-half $3^{rd}$ flow segment (or a third-half concentric feed conduit) S3-3 that starts at the second $2^{nd}$ middle point M2-2 and ends at the $3^{rd}$ outlet 371-3 to arrive at the $3^{rd}$ outlet 371-1. The process gas can also travel in the feed tube 311 along a $4^{th}$ flow path consisting of the first-half flow segment (or the first-half concentric feed conduit) S1, the second-half $2^{nd}$ flow segment (or the second-half concentric feed conduit) S2-2, and a third-half $4^{th}$ flow segment (or a third-half $4^{th}$ concentric feed conduit) S3-4 that starts at the second $2^{nd}$ middle point M2-2 and ends at the $4^{th}$ outlet 371-4 to arrive at the $4^{th}$ outlet 371-4. In an embodiment, a flow path along which a process gas travels can be split into two opposite directions as the process gas flows from an inner concentric feed conduit (e.g., the first-half concentric feed conduit S1) to two outer concentric feed conduits (e.g., the second-half $1^{st}$ concentric feed conduit S2-1 and the second-half $2^{nd}$ concentric feed conduit S2-2) until reaching the outlets into corresponding gas channels and gas conduits. In an embodiment, each of the concentric feed conduits e.g., S1, S2-1, S2-2, can split the flow of the process gas in either direction so that the flow paths of the process gas is of even length and the flow can be evenly divided.

In an embodiment, the second-half $1^{st}$ and $2^{nd}$ concentric feed conduits S2-1 and S2-2 have the same cross-sectional profile (e.g., the same inner radius), and the third-half $1^{st}$, $2^{nd}$, $3^{rd}$ and $4^{th}$ concentric feed conduits S3-1, S3-2, S3-3 and S3-4 have the same cross-sectional profile (e.g., the same inner radius). In another embodiment, the first-half concentric feed conduit S1 is larger than each of the second-half $1^{st}$ and $2^{nd}$ concentric feed conduits S2-1 and S2-2 in cross-sectional profile, and each of the second-half $1^{st}$ and $2^{nd}$ concentric feed conduits S2-1 and S2-2 is larger than each of the third-half $1^{st}$, $2^{nd}$, $3^{rd}$ and $4^{th}$ concentric feed conduits S3-1, S3-2, S3-3 and S3-4 in cross-sectional profile.

As the length L2-1 of the second-half $1^{st}$ concentric feed conduit S2-1 and the length L2-2 of the second half-$2^{nd}$ concentric feed conduit S2-2 are equal and the length L3-1 of the third-half 1st concentric feed conduit S3-1, the length L3-2 of the third-half 2nd concentric feed conduit S3-2, the length L3-3 of the third-half 3rd concentric feed conduit S3-3 and the length L3-4 of the third-half 4th concentric feed conduit S3-4 are equal, the 1st flow path, the 2nd flow path, the 3rd flow path and the 4th flow path are also equal in lengths, and, therefore, the process gas is delivered to the 1st outlet 371-1, the 2nd outlet 371-2, the 3rd outlet 371-3 and the 4th outlet 371-4 in a balanced manner. Accordingly, gas pressures and concentrations of the process gas at the 1st outlet 371-1, the 2nd outlet 371-2, the 3rd outlet 371-3 and the 4th outlet 371-4 are equal, and, therefore, the film deposited and formed on the substrate 140 has a uniform thickness in a case where the wafer holder 130 has a flat top surface and only one of the substrate 140 is placed on the top surface of the substrate holder 130, or the films deposited and formed on the substrates 140 have the same thicknesses in a case where the substrate holder 130 has a plurality of recesses formed on a top surface thereof and a plurality of the substrates 140 are placed in the recesses, respectively.

As the showerhead 120 supplies multiple chemistries to the chamber 110, it may be desirable in some processes to have more than one chemistry delivered to the chamber 110 at the same time and in a defined ratio. More than one chemistry can flow into the chamber 110 at one time. It may also be desirable to make sure that some chemistries that are supplied through the showerhead 120 are not present in the chamber 110 at the same time as other chemistries supplied through the showerhead 120. In order to prevent this case, a purge step is introduced after a chemistry is delivered into the chamber 110. Under the standard operation, this is done by turning off the supply of chemistry to the inlets (i.e., ends of first and second supply lines 151 and 152 connected to the first and second plenums 121 and 122) of the showerhead 120 and at these same inlets replacing the chemistry flow with a purging flow until all the channels (e.g., the first gas channels 123 and 123', the second gas channels 124 and 124', the first gas conduits 125 and 125' and the second gas conduits 126 and 126') within the showerhead 120 for these channels to the chamber 110 to have been purged of the chemistry previously supplied. When the channels have been purged, the next chemistry can be introduced through its own channel. The purge gas flow of the previously run channel must continue to run purge gas to the chamber 110, perhaps at a lower rate, in order to prevent the next chemistry delivered to the chamber 110 from backflowing into it via molecular diffusion and creating contamination by mixing within the showerhead 120. The standard purging operation can take a long time due to the large volume of the showerhead distribution network.

Aspects of the present disclosure provide a quick purge design to greatly reduce the purge time by removing the requirement of purging the large volumes of the showerhead distribution network.

Figure 4:
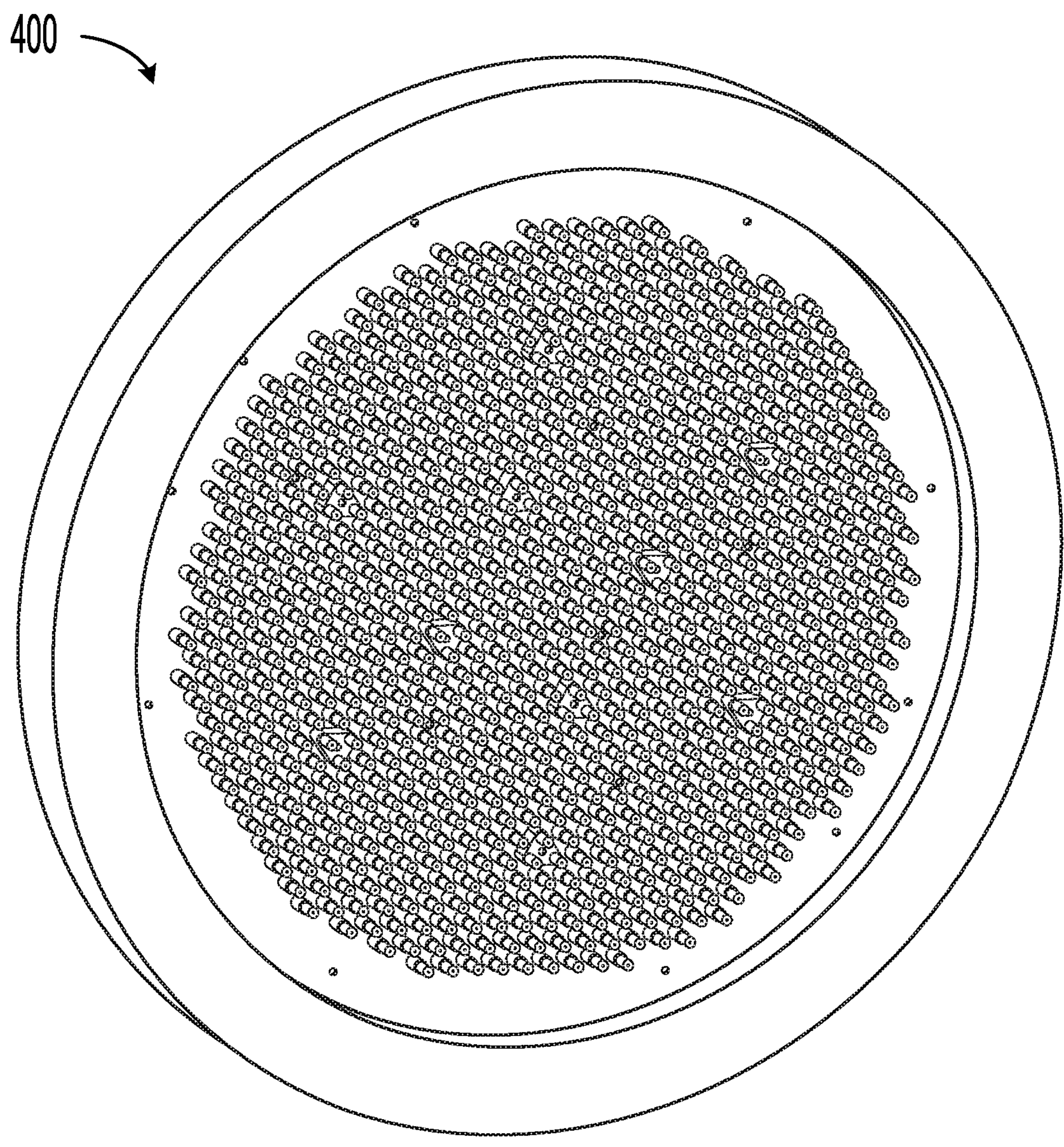
FIG. 4 shows an exemplary upper shower plate of the showerhead according to some embodiments of the present disclosure.
Figure 5:
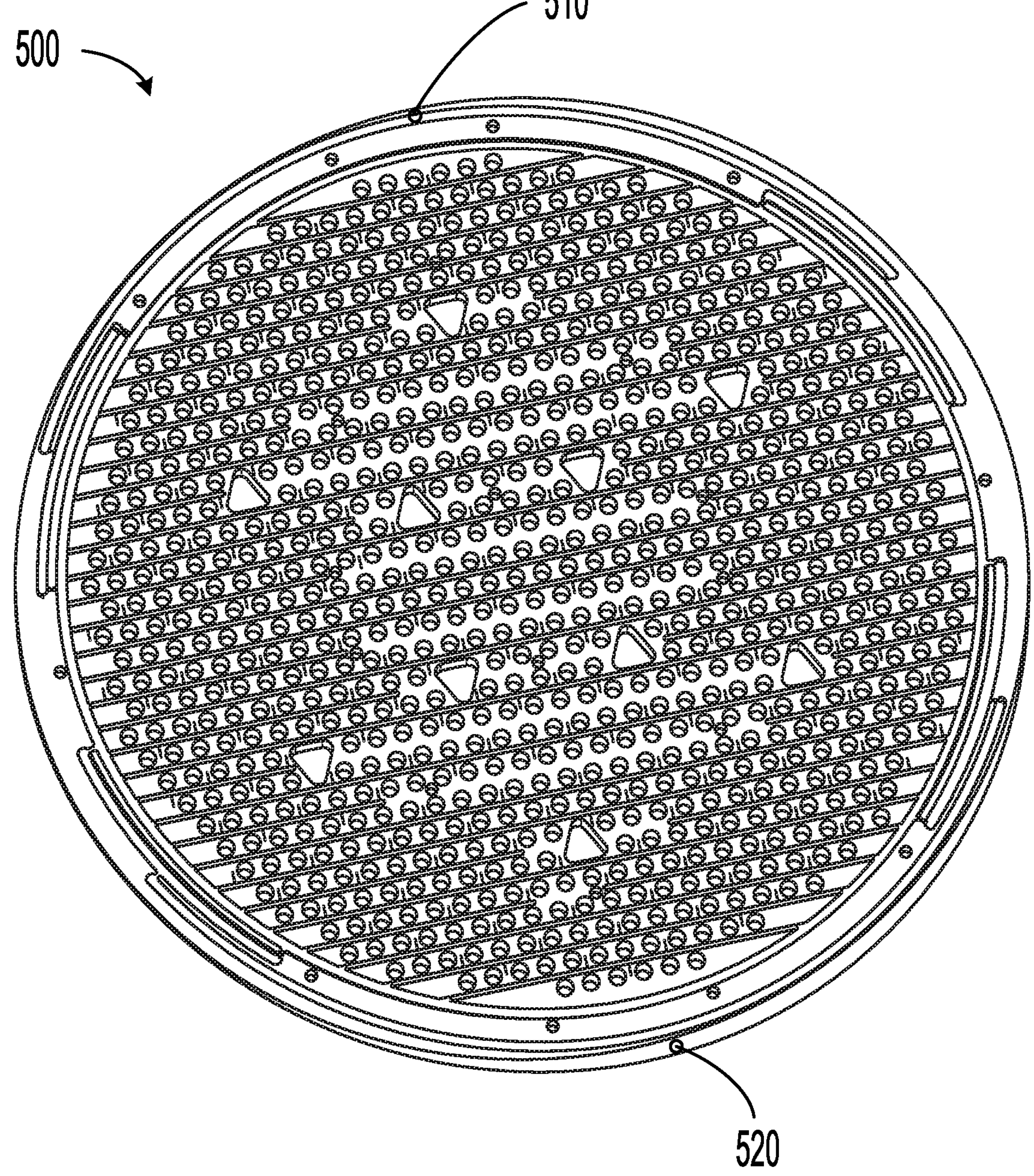
FIG. 5 shows an exemplary purge plate of the showerhead according to some embodiments of the present disclosure.

FIG. 4 shows an exemplary upper shower plate 400 of the showerhead 220 according to some embodiments of the present disclosure. In an embodiment, the first and second gas channels 223 and 224 can be included in the upper shower plate 400. FIG. 5 shows an exemplary purge plate 500 of the showerhead 220 according to some embodiments of the present disclosure. The purge plate 500 can be mounted to the upper shower plate 400. In an embodiment, the purge plate 500 can include a plurality of gas inlets, e.g., a first gas inlet 510 and a second gas inlet 520. In another embodiment, the purge plate 500 can further include a plurality of through holes 530 at the end of each branch that are used to feed the purge gas plenums on the other side of this part. In an embodiment, each of the first and second gas conduits 225 and 226 of the showerhead 220 can be bisected and at this bisection point a flow of purge gas can be introduced. This can be done by the creation of a purge gas plenum between the upper shower plate 400 and a lower shower plate (in which the first and second gas conduits 225 and 226 can be included). In an embodiment, the purge gas plenum can be fed by an even distribution of gas provided by the delivery network in the purge plate 500.

Figure 6:
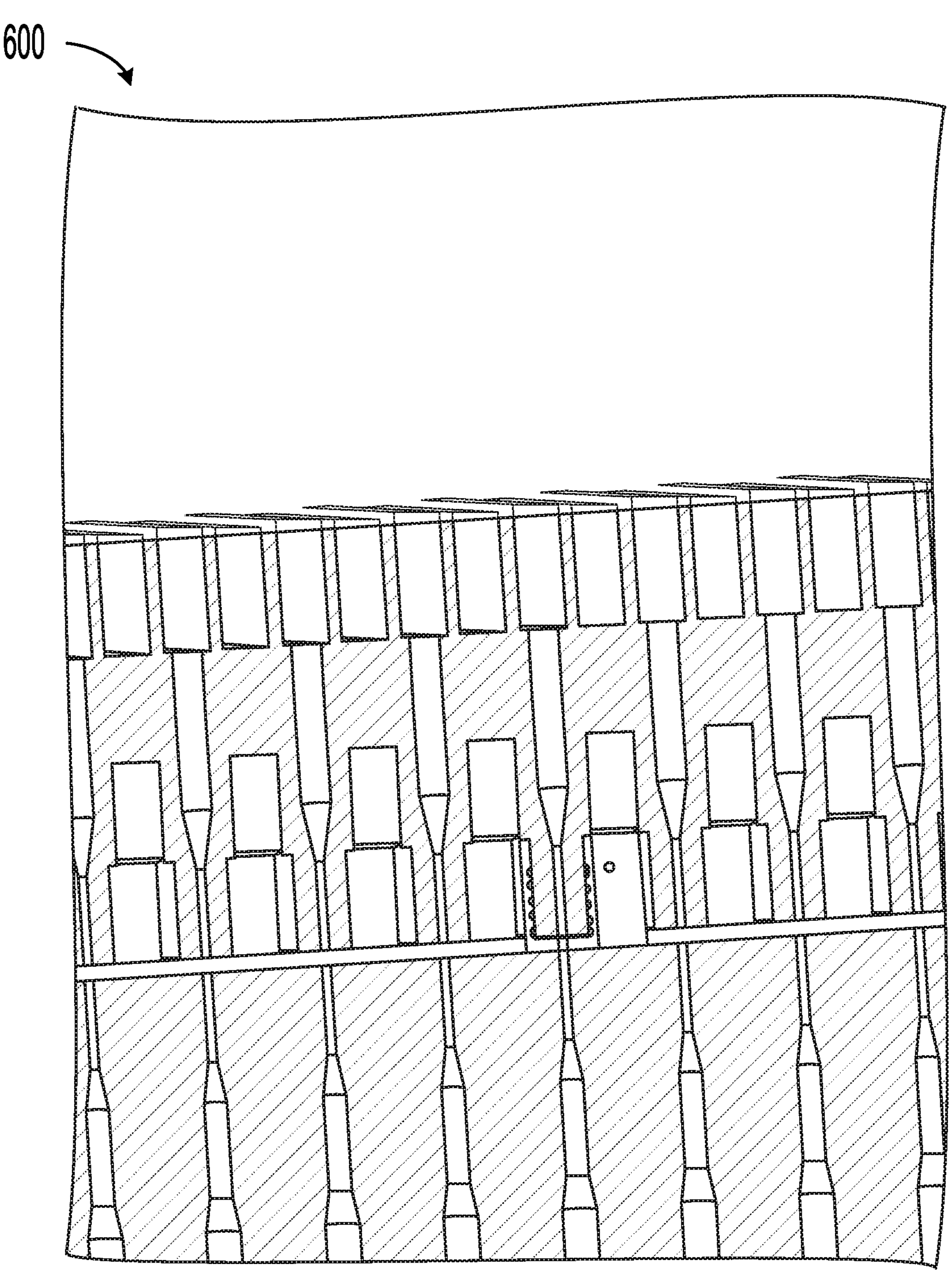
FIGS. 6 and 7 show side views of exemplary showerheads according to some embodiments of the present disclosure.
Figure 7:
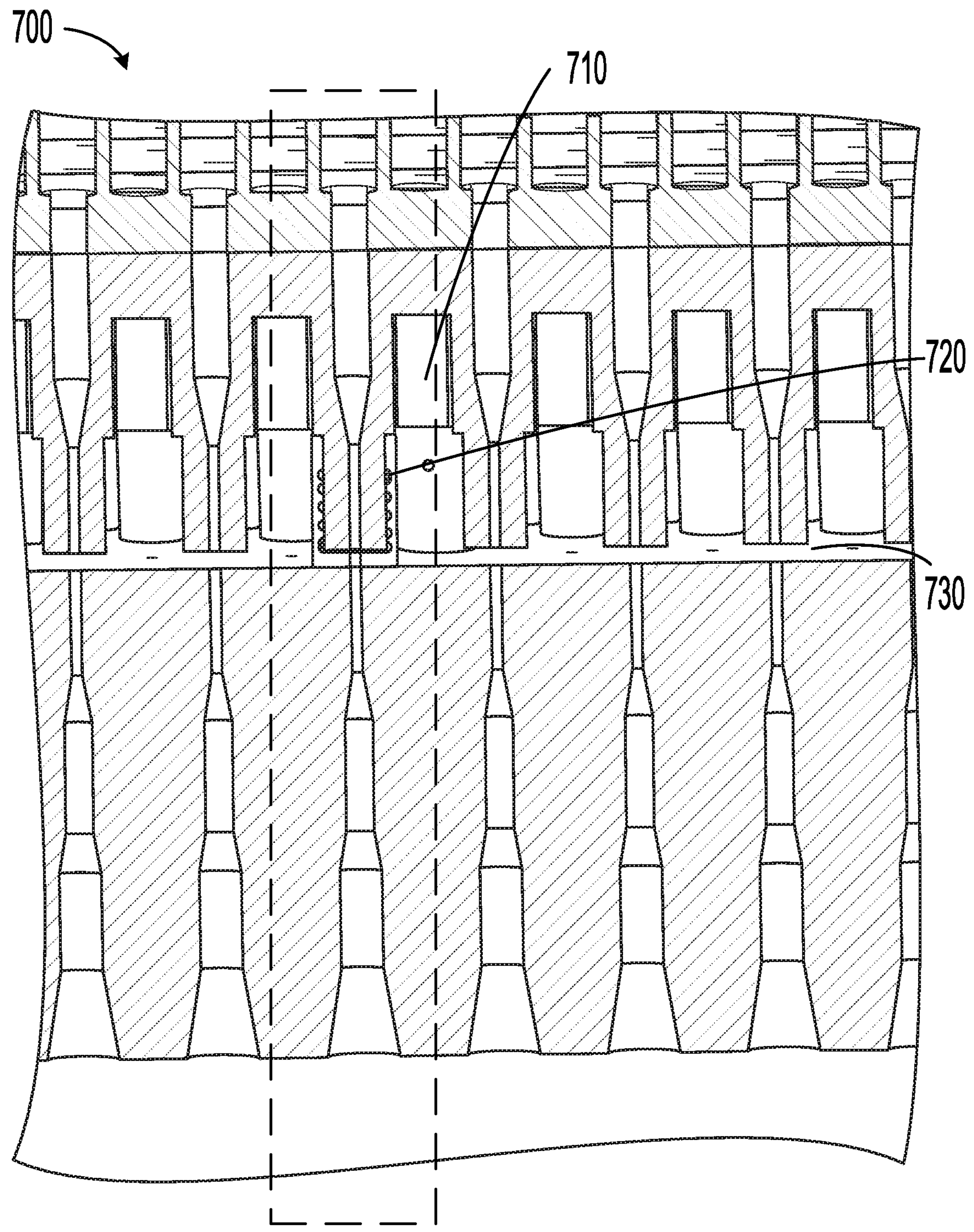

FIGS. 6 and 7 show side views of a portion of exemplary showerheads 600 and 700, respectively, e.g., the showerhead 220, according to some embodiments of the present disclosure. In an embodiment, the showerhead 700 can include purge covers 710, purge caps 720 mounted to an upper shower plate, e.g., the upper shower plate 400, and purge gas plenums 730 outside the purge caps 720. FIG. 7 is a limit view (indicated by a dashed line) to the single hole that has the purge cap 720 in place. In an embodiment, each of the purge gas plenums 730 can provide even supply of purge gas to a corresponding one of the purge caps 720. In an embodiment, the purge caps 720 can be pressed onto each protrusion that is around each of the first and second gas channels 223 and 224 in the upper shower plate 400. In this way, each of the first and second gas conduits 225 and 226 to the chamber 110 can be intersected by an injection of purge gas.

Figure 8:
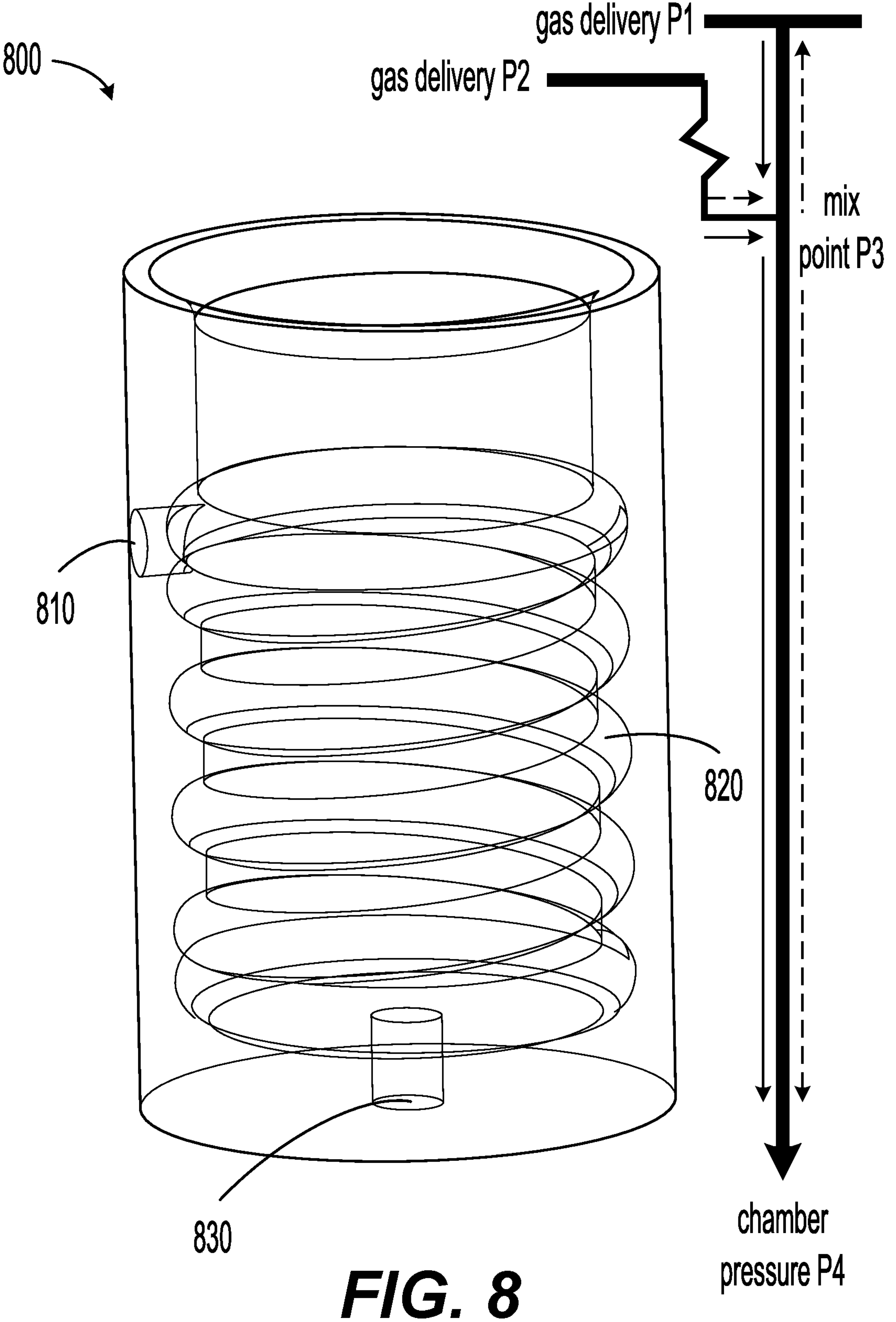
FIG. 8 is a perspective view of an exemplary purge cap of a showerhead according to some embodiments of the present disclosure.

FIG. 8 is a perspective view of an exemplary purge cap 800, e.g., the purge cap 720, according to some embodiments of the present disclosure. In an embodiment, the purge cap 800 can include a cap inlet 810, a purge gas conduit 820 and a cap outlet 830. As shown in FIG. 8, gas delivery P1 indicates a location where the first and second gas channels 223 and 224 are located that feed the first and second gas conduits 225 and 226. The pressure that is in the first and second gas channels 223 and 224 is represented as P1. There are two states for P1, i.e., a supply state and a purge state.

In the supply state, the first and second supply lines 151 and 152 that deliver the first and second process gases 161 and 162 to the first and second plenums 121 and 122, respectively, are opened, supplying flow in the direction toward the chamber 110. This creates a pressure at P1 that is greater than the chamber pressure (P4) so flow in the first and second gas conduits 225 and 226 is completely in the direction from the first and second gas channels 223 and 224. Purge flow is always flowing, so the first and second process gases 161 and 162 supplied from the first and second gas conduits 225 and 226 are mixed with the purge flow at the purge cap intersection point, e.g., the cap outlet 830, and proceed toward the chamber 110 since the pressure at the mix point (P3) is held above the chamber pressure (P4). This flow pattern is represented by the solid arrows in FIG. 8.

In the purge state, the first and second supply lines 151 and 152 are closed. A low pressure can be created at the inlets. In an embodiment, the inlet pressure (P2) (e.g., mTorr-3 range) can be held below the chamber pressure (P4) (e.g., mTorr-3 range) in order to create a condition where the pressure in the first and second gas channels 223 and 224 is below the pressure found at the mix point (P3) and held in a range in the area of the chamber pressure (P4). With this pressure condition, the purge flow entering the mix point divides since there are two outlets with a lower pressure, i.e., case A: flowing down to the chamber 110 through the lower half of the first and second gas conduits 225 and 226, and case B: flowing up to the first and second gas channels 223 and 224 through the upper half of the first and second gas conduits 225 and 226. The flow path in case A is now the only portion of the showerhead 220 that needs to be purged.

The flow path is short and can be purged out almost instantly. The flow path in case B isolated the upper portions of the showerhead 220 with its large volume that is difficult to purge. This can be done by creating an opposing flow of purge gas that will overcome any gas diffusion of chemistry down from that region. This flow pattern is represented by the dashed arrows in FIG. 8.

As shown in FIG. 8, gas delivery P2 represents a pressure in the purge gas plenum 730 between the upper shower plate 400 and the lower shower plate. This is the pressure that feeds the purge cap inlet 810. In an embodiment, the purge caps 800 can be pressed onto cylindrical protrusions that project out from the upper shower plate so that the inner wall of spiral purge gas conduits 820 can be created by the outside wall of the cylindrical protrusions. In an embodiment, the every one of the first and second gas conduits 225 and 226 to the chamber 110 can be intersected. If no purge gas were to flow, all chemistries being delivered would diffuse or flow into this apace, mix and cross contaminate. Therefore, the purge flow is always flowing. The long, optionally spiral, flow path provides sufficient flow resistance to ensure that the pressure (P2) can be high enough to create a strong viscous flow condition in the purge gas conduits 820 to overcome back diffusion of chemistry into the purge gas plenum 730. It also is designed to limit the required purge flow so that the process chemistry does not become too dilute.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the present disclosure. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the present disclosure. Such variations are intended to be covered by the scope of this disclosure. As such, the foregoing descriptions of embodiments of the present disclosure are not intended to be limiting. Rather, any limitations to embodiments of the present disclosure are presented in the following claims.

What is claimed is:

1. An apparatus, comprising:

an array of gas channels that extend parallel to each other, the array of gas channels including:

a plurality of rows of first gas channels that are configured to distribute a first process gas; and a plurality of rows of second gas channels that alternate with the rows of first gas channels and configured to distribute a second process gas;

an array of feed tubes located above the array of gas channels, the array of feed tubes including:

first feed tubes, each of which includes a plurality of first outlets corresponding to a row of the first gas channels and is configured to deliver the first process gas to the row of the first gas channels via the first outlets along different first flow paths of a same first length; and second feed tubes, each of which includes a plurality of second outlets corresponding to a row of the second gas channels and is configured to deliver the second process gas to the row of the second gas channels via the second outlets along different second flow paths of a same second length; and a plurality of vertical gas conduits, each of which vertically extends from a respective one of the array of gas channels and configured to transmit the first process gas or the second process gas.

2. The apparatus of claim 1, wherein each of the first feed tubes includes a plurality of first concentric feed conduits with a first flow path that splits the first process gas to flow toward opposite directions as the first process gas flows from an inner first feed conduit to outer first feed conduits until reaching a corresponding one of the outlets of the first feed tube.

3. The apparatus of claim 2, wherein the inner first feed conduit is larger than the outer first feed conduit, allowing a greater amount of the first process gas to flow in the inner first feed conduct than in the outer first feed conduit.

4. The apparatus of claim 1, further comprising:

a processing chamber, to which the vertical gas conduits transmit the first process gas or the second process gas and within which the first process gas or the second process gas react with each other.

5. The apparatus of claim 4, further comprising:

a substrate holder configured for receiving a substrate such that the substrate is disposed within the processing chamber for the reacted first or second process gases to be deposited thereon.

6. The apparatus of claim 4, further comprising:

a purge gas inlet formed on a sidewall of at least one of the vertical gas conduits.

7. The apparatus of claim 6, further comprising:

a controller configured to control flowing of purge gas such that the purge gas enters the vertical gas conduit and flows with the at least one of the first process gas or the second process gas to the processing chamber.

8. The apparatus of claim 6, wherein the controller is further configured to control flowing of the purge gas such that the purge gas enters the vertical gas conduit and flows toward a source of at least one of the first process gas and the second process gas.

9. The apparatus of claim 1, further comprising:

a controller configured to control flowing of the first process gas and the second process gas.

10. The apparatus of claim 1, wherein one of the first and second gas channels has a rectangular cross section.

11. The apparatus of claim 1, wherein the first gas channels are in fluid isolation from the second gas channels.

12. The apparatus of claim 1, further comprising a plurality of purge caps, through which a purge gas flows and joins the first gas channels and the second gas channels.

13. The apparatus of claim 12, wherein each of the purge caps includes a cap inlet, a purge gas conduit and a cap outlet.

14. The apparatus of claim 13, wherein the purge gas conduit is spiral.

15. The apparatus of claim 1, wherein the first and second feed tubes are perpendicular to the vertical gas conduits.

* * * * *